(12) United States Patent
Lee

(10) Patent No.: US 9,337,842 B1
(45) Date of Patent: May 10, 2016

(54) LOW VOLTAGE DIFFERENTIAL SIGNALING (LVDS) DRIVING CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/551,280

(22) Filed: Nov. 24, 2014

(51) Int. Cl.
*H03K 19/01* (2006.01)
*H03K 19/0185* (2006.01)
*H03K 19/018* (2006.01)
*H03K 5/13* (2014.01)
*H03K 5/135* (2006.01)

(52) U.S. Cl.
CPC ........ *H03K 19/018514* (2013.01); *H03K 5/131* (2013.01); *H03K 5/135* (2013.01); *H03K 19/01812* (2013.01); *H03K 19/018528* (2013.01)

(58) Field of Classification Search
CPC . H03K 5/131; H03K 5/135; H03K 19/01812; H03K 19/018528; H03K 19/018514
USPC .............................. 327/64, 108, 109, 112, 333
See application file for complete search history.

(56) References Cited

U.S. PATENT DOCUMENTS

| 8,952,725 | B2 | 2/2015 | Lee et al. |
| 2007/0263749 | A1 | 11/2007 | Teng et al. |
| 2008/0054953 | A1* | 3/2008 | Chen ............ H03K 19/018528 327/108 |
| 2012/0217999 | A1 | 8/2012 | Lee et al. |
| 2012/0299618 | A1 | 11/2012 | Sayuk et al. |

FOREIGN PATENT DOCUMENTS

| CN | 102324922 A | 1/2012 |
| CN | 102624656 A | 8/2012 |
| CN | 103248352 A | 8/2013 |
| CN | 103650341 A | 3/2014 |
| JP | 2011228762 A | 11/2011 |

* cited by examiner

*Primary Examiner* — John Poos
(74) *Attorney, Agent, or Firm* — McClure, Qualey & Rodack, LLP

(57) ABSTRACT

An LVDS (Low Voltage Differential Signaling) driving circuit includes a first transistor, a second transistor, a third transistor, a fourth transistor, a first resistor, a second resistor, and a bias driver. The first transistor is coupled between a supply voltage and a first node. The second transistor is coupled between the supply voltage and a second node. The third transistor is coupled between the first node and a ground voltage. The fourth transistor is coupled between the second node and the ground voltage. The first resistor is coupled between the first node and a third node. The second resistor is coupled between the second node and the third node. The bias driver generates bias signals for controlling the first, second, third, and fourth transistors according to a data signal.

24 Claims, 12 Drawing Sheets

LOW VOLTAGE DIFFERENTIAL SIGNALING (LVDS) DRIVING CIRCUIT

BACKGROUND OF THE INVENTION

1. Field of the Invention

The disclosure generally relates to an LVDS (Low Voltage Differential Signaling) driving circuit, and more particularly, to an LVDS driving circuit with a simplified circuit structure and a high operating speed.

2. Description of the Related Art

Differential signaling circuits are very popular, being used in data transmission nowadays, including LVDS (Low Voltage Differential Signaling), HDMI (High-Definition Multimedia Interface), and USB (Universal Serial Bus), etc. Differential signaling circuits have power saving and noise rejection advantages. However, conventional differential signaling circuits require bias currents which are driven by current sources. With the progress in manufacturing technology, the supply voltage of circuits has gradually become lower. As a result, the current sources may have insufficient head room, and the output range of the differential signaling circuits may be very limited.

BRIEF SUMMARY OF THE INVENTION

In a preferred embodiment, the invention is directed to an LVDS (Low Voltage Differential Signaling) driving circuit generating a differential signal at a first node and a second node according to a data signal, including: a first transistor, including a first terminal coupled to a supply voltage and a second terminal coupled to the first node, wherein the first transistor and a first driver form a first current mirror when the data signal is at a high logic level and do not form the first current mirror when the data signal is at a low logic level; a second transistor, including a first terminal coupled to the supply voltage and a second terminal coupled to the second node, wherein the second transistor and a second driver form a second current mirror when the data signal is at the low logic level and do not form the second current mirror when the data signal is at the high logic level; a third transistor, including a first terminal coupled to a ground voltage and a second terminal coupled to the first node, wherein the third transistor and a third driver form a third current mirror when the data signal is at the low logic level and do not form the third current mirror when the data signal is at the high logic level; and a fourth transistor, including a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level.

In some embodiments, each of the first driver and the second driver includes: a fifth transistor, wherein the fifth transistor has a control terminal coupled to a fourth node, a first terminal coupled to the supply voltage, and a second terminal coupled to the fourth node, wherein the fourth node has a first constant bias voltage; a first current sink, drawing a current from the fourth node; and a first operational amplifier, wherein the first operational amplifier has a negative input terminal coupled to the fourth node, a positive input terminal coupled to a first driving node, and an output terminal coupled to the positive input terminal according to the data signal, wherein the first driving node of the first driver is coupled to a control terminal of the first transistor and the first driving node of the second driver is coupled to a control terminal of the second transistor.

In some embodiments, each of the first driver and the second driver further includes: a first switch, wherein the first switch has a first terminal coupled to the output terminal of the first operational amplifier, and a second terminal; a second switch, wherein the second switch has a first terminal coupled to the second terminal of the first switch, and a second terminal coupled to the ground voltage; and a sixth transistor, wherein the sixth transistor has a control terminal coupled to the second terminal of the first switch, a first terminal coupled to the supply voltage, and a second terminal coupled to the first driving node.

In some embodiments, in the first driver, the first switch is on and the second switch is off when the data signal is at the low logic level, and the first switch is off and the second switch is on when the data signal is at the high logic level, and wherein in the second driver, the first switch is on and the second switch is off when the data signal is at the high logic level, and the first switch is off and the second switch is on when the data signal is at the low logic level.

In some embodiments, each of the first driver and the second driver further includes a fast setting circuit coupling a third driving node to the ground voltage according to a voltage difference between the first constant bias voltage and the first driving node, wherein the third driving node of the fast setting circuit of the first driver is coupled to the control terminal of the first transistor and the third driving node of the fast setting circuit of the second driver is coupled to the control terminal of the second transistor.

In some embodiments, the fast setting circuit includes: a first comparator, outputting a first comparison signal according to the voltage difference between the first constant bias voltage and the first driving node; a first edge detector, detecting rising edges of the data signal or an inverted data signal, and generating a first detection signal; a second edge detector, detecting rising edges of the first comparison signal, and generating a second detection signal; a first SR latch, including an S input receiving the first detection signal, an R input receiving the second detection signal, and an output; and a ninth transistor, wherein the ninth transistor has a control terminal coupled to the output of the first SR latch, a first terminal coupled to the ground voltage, and a second terminal coupled to the third driving node.

In some embodiments, each of the third driver and the fourth driver includes: a seventh transistor, wherein the seventh transistor has a control terminal coupled to a sixth node, a first terminal coupled to the ground voltage, and a second terminal coupled to the sixth node, wherein the sixth node has a second constant bias voltage; a first current source, supplying a current to the sixth node; and a second operational amplifier, wherein the second operational amplifier has a negative input terminal coupled to the sixth node, a positive input terminal coupled to a second driving node, and an output terminal coupled to the positive input terminal according to the data signal, wherein the second driving node of the third driver is coupled to a control terminal of the third transistor and the second driving node of the fourth driver is coupled to a control terminal of the fourth transistor.

In some embodiments, each of the third driver and the fourth driver further includes: a fourth switch, wherein the fourth switch has a first terminal coupled to the output terminal of the second operational amplifier, and a second terminal; a third switch, wherein the third switch has a first terminal coupled to the second terminal of the fourth switch, and a second terminal coupled to the supply voltage; and an eighth transistor, wherein the eighth transistor has a control terminal coupled to the second terminal of the fourth switch, a first terminal coupled to the ground voltage, and a second terminal coupled to the second driving node.

In some embodiments, in the third driver, the third switch is on and the fourth switch is off when the data signal is at the high logic level, and the third switch is off and the fourth switch is on when the data signal is at the low logic level, and wherein in the fourth driver, the third switch is on and the fourth switch is off when the data signal is at the low logic level, and the third switch is off and the fourth switch is on when the data signal is at the high logic level.

In some embodiments, each of the third driver and the fourth driver further includes a fast setting circuit coupling a fourth driving node to the supply voltage according to a voltage difference between the second constant bias voltage and the second driving node, wherein the fourth driving node of the fast setting circuit of the third driver is coupled to the control terminal of the third transistor and the fourth driving node of the fast setting circuit of the fourth driver is coupled to the control terminal of the fourth transistor.

In some embodiments, the fast setting circuit includes: a second comparator, outputting a second comparison signal according to the voltage difference between the second constant bias voltage and the second driving node; a third edge detector, detecting rising edges of the data signal or an inverted data signal, and generating a third detection signal; a fourth edge detector, detecting rising edges of the second comparison signal, and generating a fourth detection signal; a second SR latch, including an S input receiving the fourth detection signal, an R input receiving the third detection signal, and an output; and a tenth transistor, wherein the tenth transistor has a control terminal coupled to the output of the second SR latch, a first terminal coupled to the supply voltage, and a second terminal coupled to the fourth driving node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
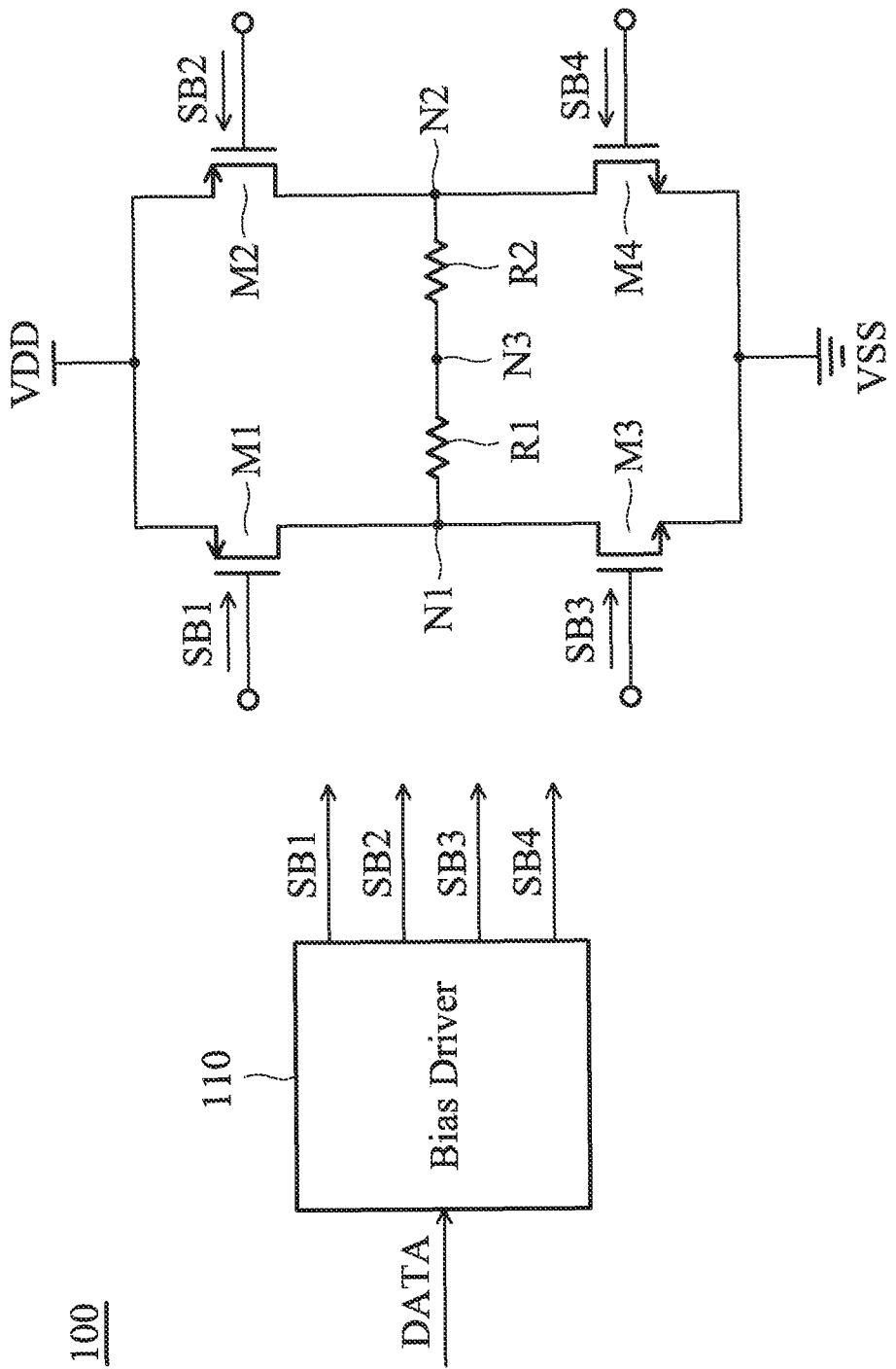
FIG. 1 is a diagram of an LVDS (Low Voltage Differential Signaling) driving circuit according to an embodiment of the invention.

FIG. 1 is a diagram of an LVDS (Low Voltage Differential Signaling) driving circuit 100 according to an embodiment of the invention. The LVDS driving circuit 100 includes a first transistor M1, a second transistor M2, a third transistor M3, a fourth transistor M4, a first resistor R1, a second resistor R2, and a bias driver 110. The bias driver 110 generates a first bias signal SB1, a second bias signal SB2, a third bias signal SB3, and a fourth bias signal SB4 for controlling the first transistor M1, the second transistor M2, the third transistor M3, and the fourth transistor M4, respectively, according to a data signal DATA. The data signal DATA may be a digital signal. In some embodiments, the first transistor M1 and the second transistor M2 are PMOS transistors (P-type Metal Oxide Semiconductor Field Effect Transistor), and the third transistor M3 and the fourth transistor M4 are NMOS transistors (N-type Metal Oxide Semiconductor Field Effect Transistor). The first transistor M1 has a control terminal for receiving the first bias signal SB1, a first terminal coupled to a supply voltage VDD (e.g., 1V), and a second terminal coupled to a first node N1. The second transistor M2 has a control terminal for receiving the second bias signal SB2, a first terminal coupled to the supply voltage VDD, and a second terminal coupled to a second node N2. The third transistor M3 has a control terminal for receiving the third bias signal SB3, a first terminal coupled to a ground voltage VSS (e.g., 0V), and a second terminal coupled to the first node N1. The fourth transistor M4 has a control terminal for receiving the fourth bias signal SB4, a first terminal coupled to the ground voltage VSS, and a second terminal coupled to the second node N2. The first resistor R1 has a first terminal coupled to the first node N1, and a second terminal coupled to a third node N3. The second resistor R2 has a first terminal coupled to the second node N2, and a second terminal coupled to the third node N3. The first node N1 may be considered a positive output terminal of the LVDS driving circuit 100. The second node N2 may be considered a negative output terminal of the LVDS driving circuit 100. The third node N3 may be considered a common node. When the first transistor M1 and the fourth transistor M4 are turned on and the second transistor M2 and the third transistor M3 are turned off, the voltage at the first node N1 is charged up, and the voltage at the second node N2 is discharged down. When the second transistor M2 and the third transistor M3 are turned on and the first transistor M1 and the fourth transistor M4 are turned off, the voltage at the first node N1 is discharged down, and the voltage at the second node N2 is charged up. That is, in addition to being switches, the first transistor M1 and the second transistor M2 are used as current sources to selectively supply currents to the first node N1 and the second node N2, and the third transistor M3 and the fourth transistor M4 are used as current sinks to selectively draw currents from the first node N1 and the second node N2. In the invention, since the necessary current sources and current sink are replaced or combined with the switch transistors M1 to M4, the proposed LVDS driving circuit 100 has fewer elements and a lower manufacturing cost. Furthermore, the output range of the LVDS driving circuit 100 is increased because it is no longer limited by the head room of the current sources and current sinks. As a result, a designer can have more freedom to apply the LVDS driving circuit 100 to a variety of systems and circuits.

The bias driver 110 may include a first driver 111, a second driver 112, a third driver 113, and a fourth driver 114, which will be discussed in the following embodiments. It should be understood that these embodiments are just exemplary, and shall not restrict limitations of the invention.

Figure 2A:
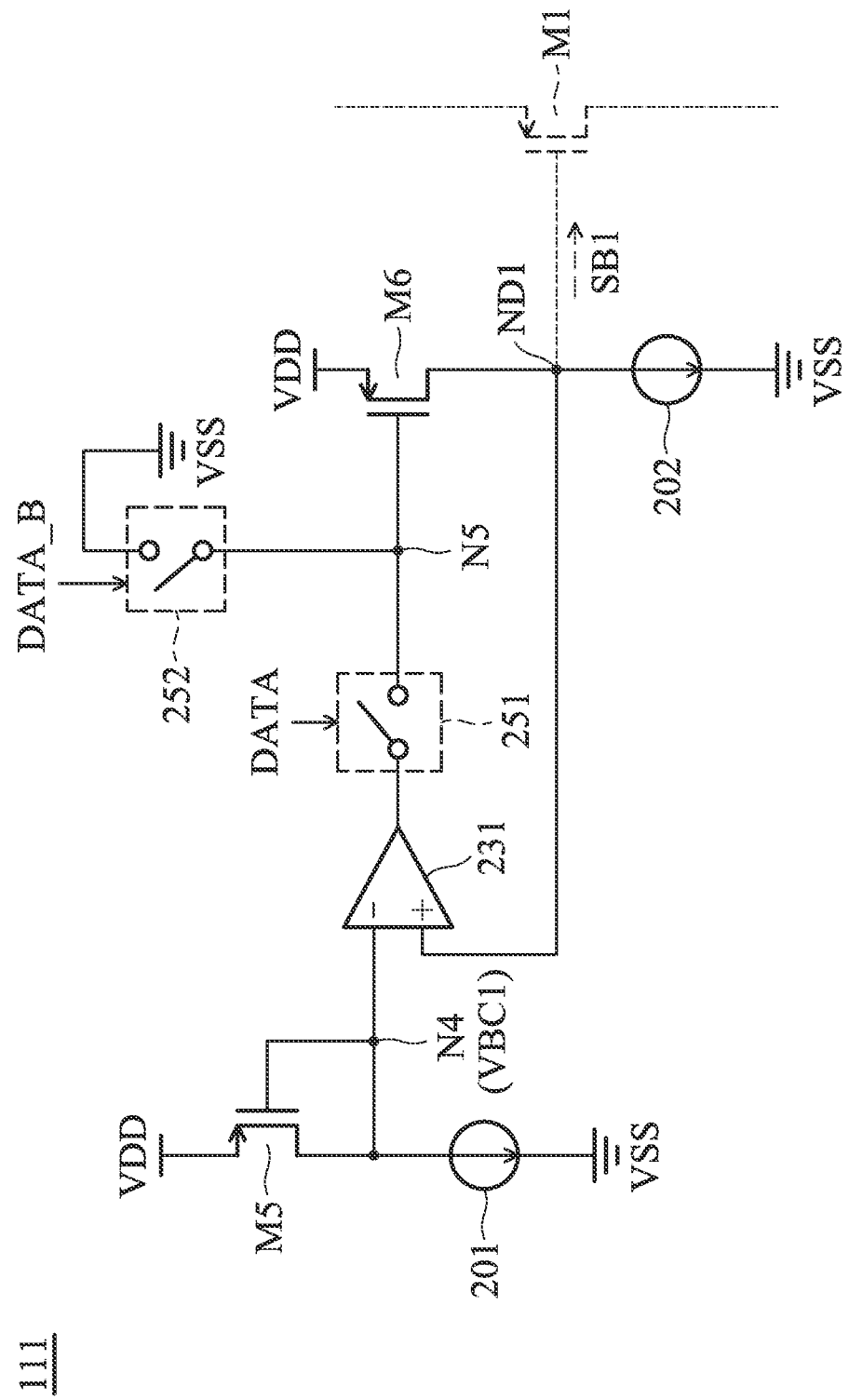
FIG. 2A is a diagram of a first driver according to an embodiment of the invention.

FIG. 2A is a diagram of the first driver 111 according to an embodiment of the invention. In the embodiment of FIG. 2A, the first driver 111 includes a first current sink 201, a second current sink 202, a first operational amplifier 231, a first switch 251, a second switch 252, a fifth transistor M5, and a sixth transistor M6. In some embodiments, the fifth transistor M5 and the sixth transistor M6 are PMOS transistors. The fifth transistor M5 has a control terminal coupled to a fourth node N4, a first terminal coupled to the supply voltage VDD, and a second terminal coupled to the fourth node N4. The first current sink 201 draws a current (e.g., 1 mA) from the fourth node N4. Since the current to the first current sink 201 is constant, the fourth node N4 has a first constant bias voltage VBC1 (e.g., 0.7V). The first operational amplifier 231 has a negative input terminal coupled to the fourth node N4, a positive input terminal coupled to a first driving node ND1, and an output terminal. The first switch 251 has a first terminal coupled to the output terminal of the first operational amplifier 231, and a second terminal coupled to a fifth node N5. The second switch 252 has a first terminal coupled to the fifth node N5, and a second terminal coupled to the ground voltage VSS. The first switch 251 is controlled by the data signal DATA, and the second switch 252 is controlled by an inverted data signal DATA_B, which has a reverse logic level of the data signal DATA. In other words, the first switch 251 and the second switch 252 are controlled by complementary signals. If one of them is turned on, the other of them should be turned off. The sixth transistor M6 has a control terminal coupled to the fifth node N5, a first terminal coupled to the supply voltage VDD, and a second terminal coupled to the first driving node ND1. The second current sink 202 draws a current (e.g., 1 mA) from the first driving node ND1. The first driving node ND1 is arranged for outputting the first bias signal SB1 to the control terminal of the first transistor M1 (represented by a dashed line, not a part of the first driver 111). When the data signal DATA is at a low logic level (e.g., a logic 0), the first switch 251 is off and the second switch 252 is on so that the control terminal of the sixth transistor M6 is coupled to the ground voltage VSS, and thus the sixth transistor M6 is turned on and the control terminal of the first transistor M1 is coupled to the supply voltage VDD so that the first transistor M1 is turned off. On the other hand, when the data signal DATA is at a high logic level (e.g., a logic 1), the first switch 251 is on and the second switch 252 is off so that a negative feedback loop is formed around the first operational amplifier 231, and thus the fourth node N4 and the first driving node ND1 are virtually short so that the first transistor M1 and the fifth transistor M5 may form a first current mirror. In one embodiment, the size of the first transistor M1 is about 10 times that of the fifth transistor M5. The first transistor M1 has a greater capability to drive current, and therefore it is used as a current source for supplying a large current (e.g., 10 mA) according to the current of the first current sink 201. The first driver 111 and the first transistor M1 form a high-speed accurate analog circuit for controlling the voltage at the first node N1 of the LVDS driving circuit 100 according to the data signal DATA.

Figure 2B:
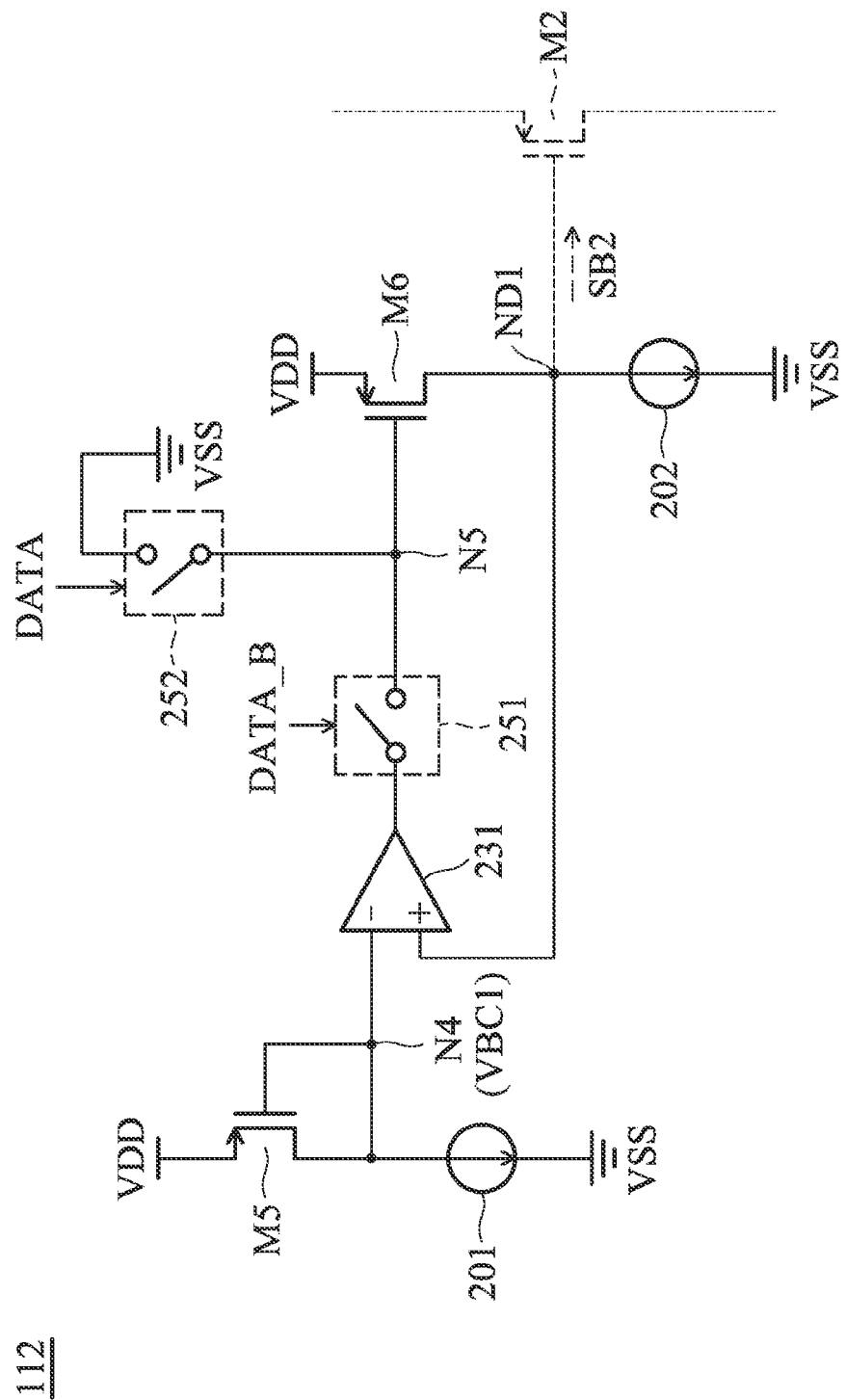
FIG. 2B is a diagram of a second driver according to an embodiment of the invention.

FIG. 2B is a diagram of the second driver 112 according to an embodiment of the invention. The second driver 112 of FIG. 2B is similar to the first driver 112 of FIG. 2A. The difference between them is that in the second driver 112, the first switch 251 is controlled by the inverted data signal DATA_B, the second switch 252 is controlled by the data signal DATA, and the first driving node ND1 is arranged for outputting the second bias signal SB2 to the control terminal of the second transistor M2 (represented by a dashed line, not a part of the second driver 112). It should be understood that the second driver 112 does not share any elements (e.g., the first operational amplifier 231, the fifth transistor M5, etc., which appear in both FIG. 2A and FIG. 2B) with the first driver 111. The same reference numerals of elements are used for readers to understand that the two circuits have similar structures and partially-identical elements. As a matter of fact, every element of FIG. 2B is independent of that of FIG. 2A. When the data signal DATA is at a high logic level (e.g., a logic 1), the first switch 251 is off and the second switch 252 is on so that the control terminal of the sixth transistor M6 is coupled to the ground voltage VSS, and thus the sixth transistor M6 is turned on and the control terminal of the second transistor M2 is coupled to the supply voltage VDD so that the second transistor M2 is turned off. On the other hand, when the data signal DATA is at a low logic level (e.g., a logic 0), the first switch 251 is on and the second switch 252 is off so that a negative feedback loop is formed around the first operational amplifier 231, and thus the fourth node N4 and the first driving node ND1 are virtually short so that the second transistor M2 and the fifth transistor M5 may form a second current mirror. In one embodiment, the size of the second transistor M2 is about 10 times that of the fifth transistor M5. The second transistor M2 has a greater capability to drive current, and therefore it is used as a current source for supplying a large current (e.g., 10 mA) according to the current of the first current sink 201. The second driver 112 and the second transistor M2 form a high-speed accurate analog circuit for controlling the voltage at the second node N2 of the LVDS driving circuit 100 according to the data signal DATA.

Figure 2C:
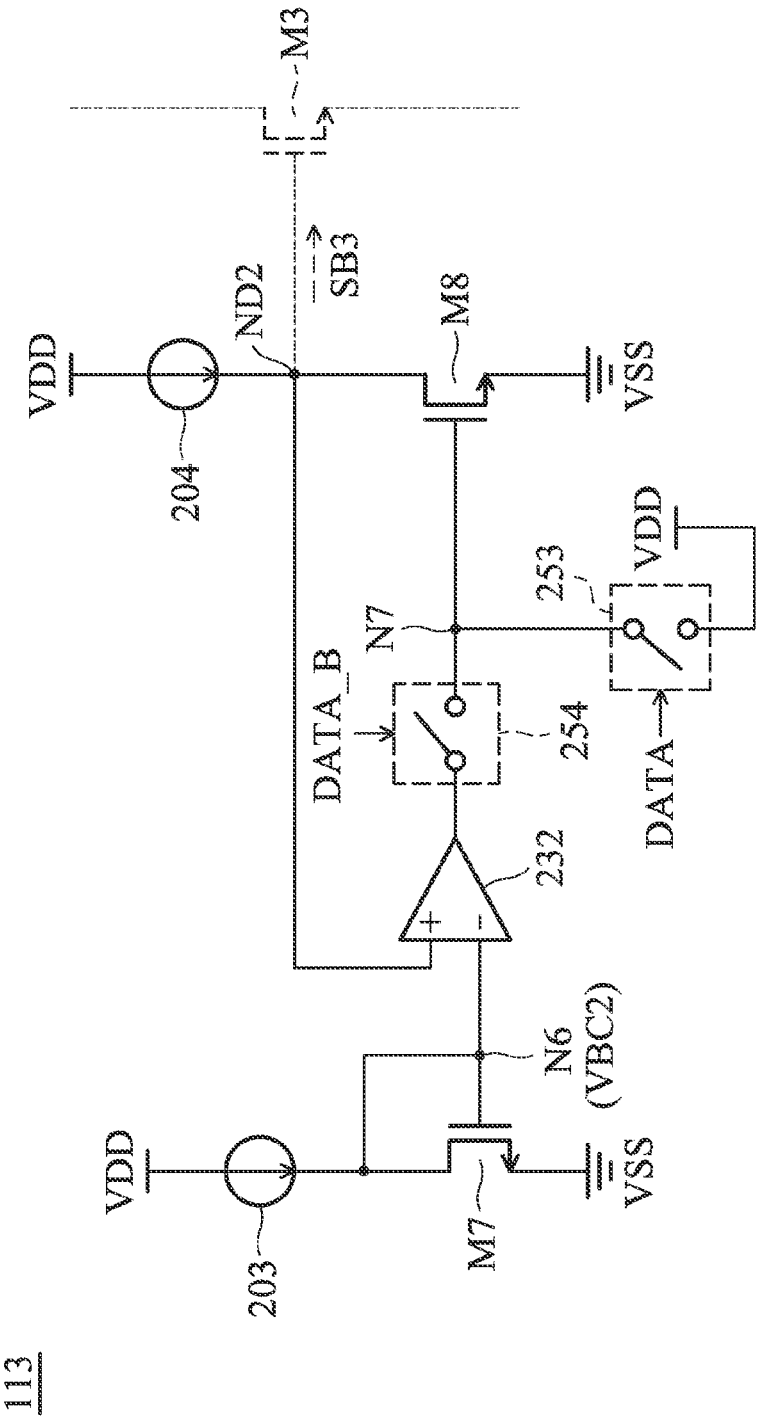
FIG. 2C is a diagram of a third driver according to an embodiment of the invention.

FIG. 2C is a diagram of the third driver 113 according to an embodiment of the invention. In the embodiment of FIG. 2C, the third driver 113 includes a first current source 203, a second current source 204, a second operational amplifier 232, a third switch 253, a fourth switch 254, a seventh transistor M7, and an eighth transistor M8. In some embodiments, the seventh transistor M7 and the eighth transistor M8 are NMOS transistors. The seventh transistor M7 has a control terminal coupled to a sixth node N6, a first terminal coupled to the ground voltage VSS, and a second terminal coupled to the sixth node N6. The first current source 203 supplies a current (e.g., 1 mA) to the sixth node N6. Since the current from the first current source 203 is constant, the sixth node N6 has a second constant bias voltage VBC2 (e.g., 0.3V). The second operational amplifier 232 has a negative input terminal coupled to the sixth node N6, a positive input terminal coupled to a second driving node ND2, and an output terminal. The third switch 253 has a first terminal coupled to a seventh node N7, and a second terminal coupled to the supply voltage VDD. The fourth switch 254 has a first terminal coupled to the output terminal of the second operational amplifier 232, and a second terminal coupled to the seventh node N7. The third switch 253 is controlled by the data signal DATA, and the fourth switch 254 is controlled by the inverted data signal DATA_B. The eighth transistor M8 has a control terminal coupled to the seventh node N7, a first terminal coupled to the ground voltage VSS, and a second terminal coupled to the second driving node ND2. The second current source 204 supplies a current (e.g., 1 mA) to the second driving node ND2. The second driving node ND2 is arranged for outputting the third bias signal SB3 to the control terminal of the third transistor M3 (represented by a dashed line, not a part of the third driver 113). When the data signal DATA is at a high logic level (e.g., a logic 1), the third switch 253 is on and the fourth switch 254 is off so that the control terminal of the eighth transistor M8 is coupled to the supply voltage VDD, and thus the eighth transistor M8 is turned on and the control terminal of the third transistor M3 is coupled to the ground voltage VSS so that the third transistor M3 is turned off. On the other hand, when the data signal DATA is at a low logic level (e.g., a logic 0), the third switch 253 is off and the fourth switch 254 is on so that a negative feedback loop is formed around the second operational amplifier 232, and thus the sixth node N6 and the second driving node ND2 are virtually short so that the third transistor M3 and the seventh transistor M7 may form a third current mirror. In one embodiment, the size of the third transistor M3 is about 10 times that of the seventh transistor M7. The third transistor M3 has a greater capability to drive current, and therefore it is used as a current sink for drawing a large current (e.g., 10 mA) according to the current of the first current source 203. The third driver 113 and the third transistor M3 form a high-speed accurate analog circuit for controlling the voltage at the first node N1 of the LVDS driving circuit 100 according to the data signal DATA.

Figure 2D:
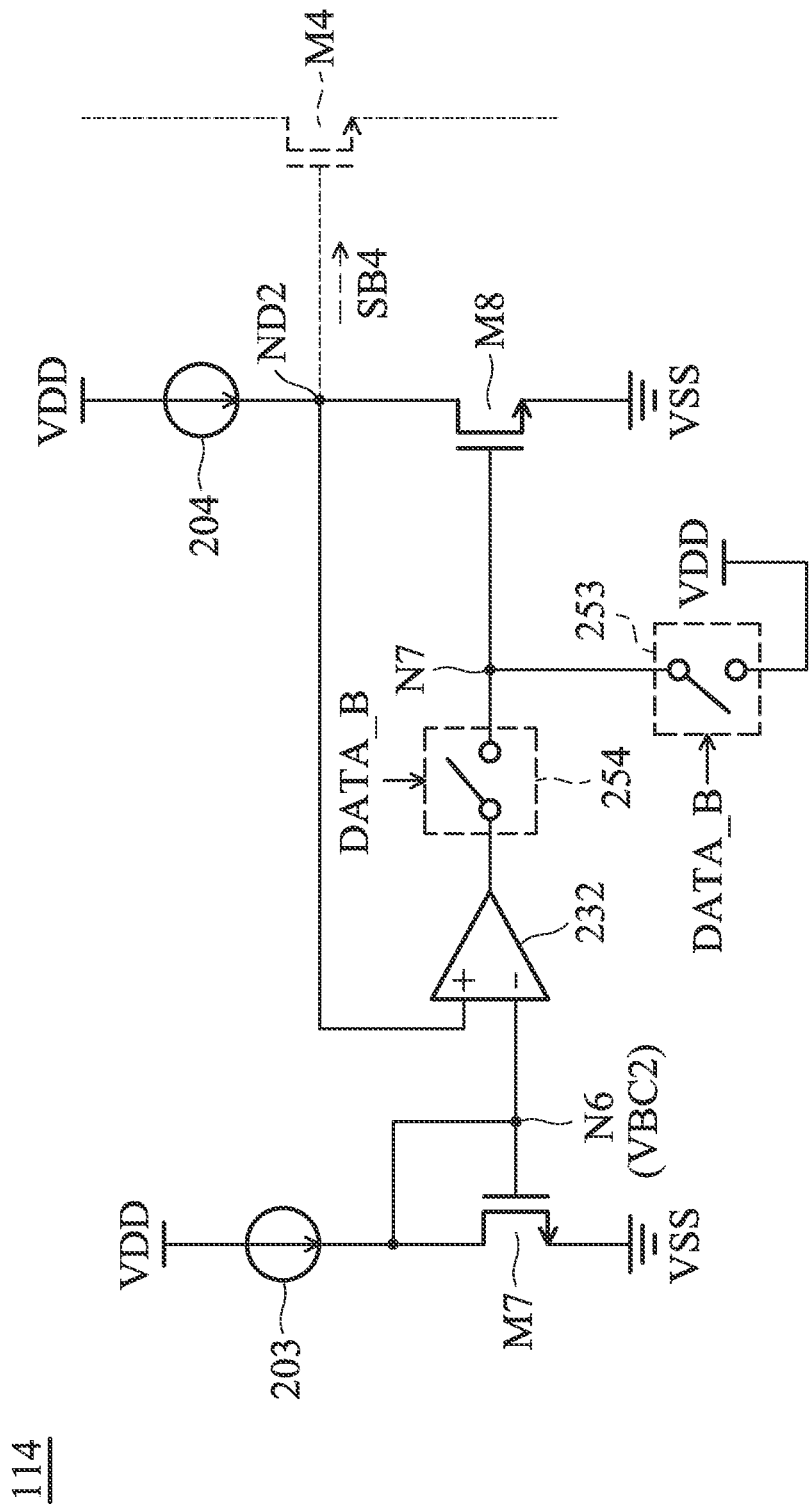
FIG. 2D is a diagram of a fourth driver according to an embodiment of the invention.

FIG. 2D is a diagram of the fourth driver 114 according to an embodiment of the invention. The fourth driver 114 of FIG. 2D is similar to the third driver 113 of FIG. 2C. The difference between them is that in the fourth driver 114, the third switch 253 is controlled by the inverted data signal DATA_B, the fourth switch 254 is controlled by the data signal DATA, and the second driving node ND2 is arranged for outputting the fourth bias signal SB4 to the control terminal of the fourth transistor M4 (represented by a dashed line, not a part of the fourth driver 114). It should be understood that the fourth driver 114 does not share any elements with the third driver 113. Every element of FIG. 2D is independent of that of FIG. 2C. When the data signal DATA is at a low logic level (e.g., a logic 0), the third switch 253 is on and the fourth switch 254 is off so that the control terminal of the eighth transistor M8 is coupled to the supply voltage VDD, and thus the eighth transistor M8 is turned on and the control terminal of the fourth transistor M4 is coupled to the ground voltage VSS so that the fourth transistor M4 is turned off. On the other hand, when the data signal DATA is at a high logic level (e.g., a logic 1), the third switch 253 is off and the fourth switch 254 is on so that a negative feedback loop is formed around the second operational amplifier 232, and thus the sixth node N6 and the second driving node ND2 are virtually short so that the fourth transistor M4 and the seventh transistor M7 may form a fourth current mirror. In one embodiment, the size of the fourth transistor M4 is about 10 times that of the seventh transistor M7. The fourth transistor M4 has a greater capability to drive current, and therefore it is used as a current sink for drawing a large current (e.g., 10 mA) according to the current of the first current source 203. The fourth driver 114 and the fourth transistor M4 form a high-speed accurate analog circuit for controlling the voltage at the second node N2 of the LVDS driving circuit 100 according to the data signal DATA.

In an ideal case, if the logic level of the data signal DATA is changed, the voltages at the driving nodes of the drivers 111, 112, 113, and 114 will be changed immediately. As a matter of fact, the transistors M1 to M4 have parasitic capacitances (modeled as virtual capacitors C1 to C4 in the following embodiments) at their control terminals, and the capacitances may result in longer transition delay time and lower operating speed of the LVDS driving circuit 100. In some embodiments, each of the drivers 111, 112, 113, and 114 further includes a fast setting circuit for providing additional driving currents and enhancing the operating speed of the LVDS driving circuit 100. It should be understood that the fast setting circuits are optional elements, and they may be omitted in alternative embodiments.

Figure 3A:
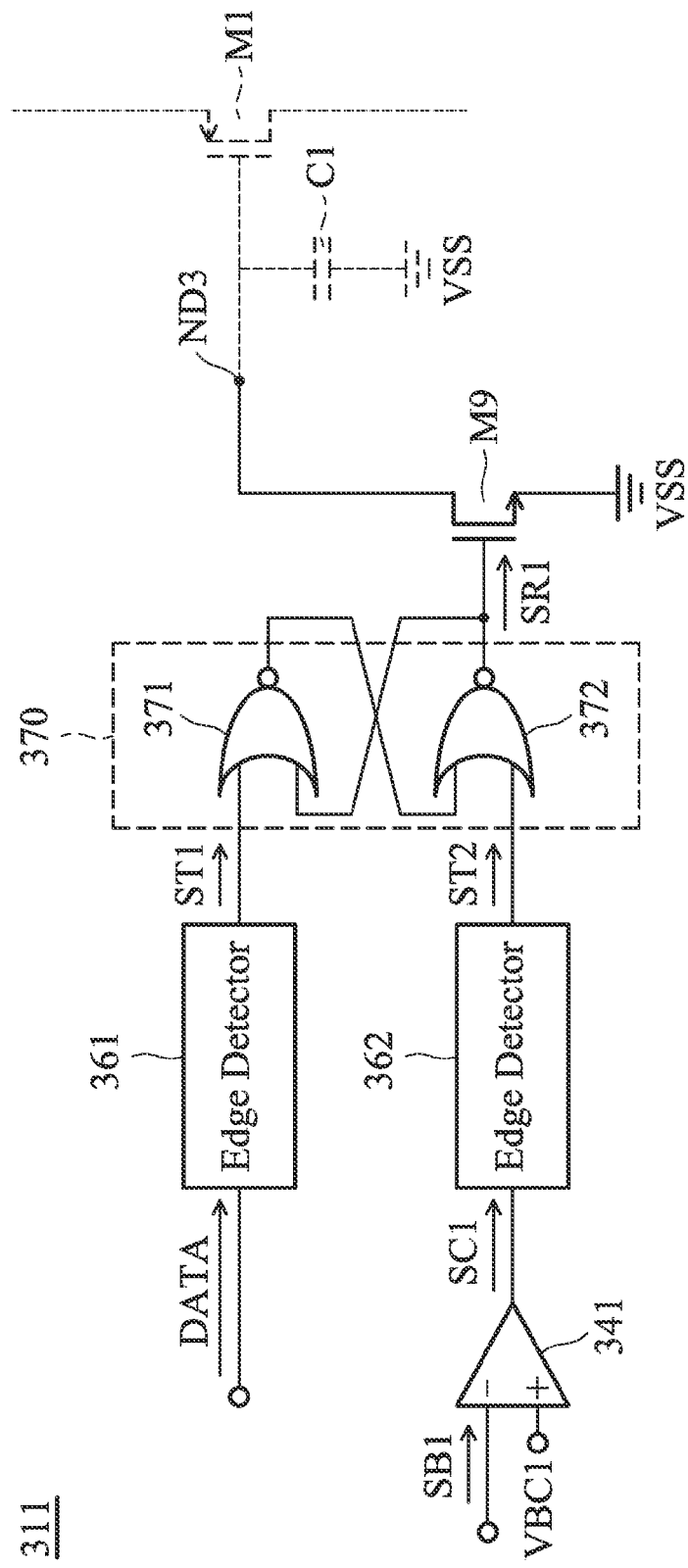
FIG. 3A is a diagram of a fast setting circuit of a first driver according to an embodiment of the invention.
Figure 4:
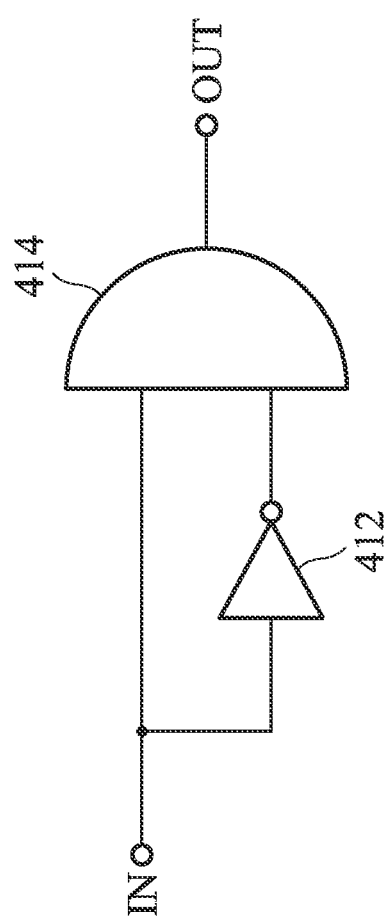
FIG. 4 is a diagram of an edge detector according to an embodiment of the invention.

FIG. 3A is a diagram of the fast setting circuit 311 of the first driver 111 according to an embodiment of the invention. In the embodiment of FIG. 3A, the fast setting circuit 311 of the first driver 111 includes a first comparator 341, a first edge detector 361, a second edge detector 362, a first SR latch 370, and a ninth transistor M9. The first comparator 341 may be implemented with an operational amplifier having no feedback path. The first comparator 341 has a negative input terminal for receiving the first bias signal SB1, a positive input terminal for receiving the first constant bias voltage VBC1, and an output terminal for outputting a first comparison signal SC1 according to a voltage difference between the first constant bias voltage VBC1 and the first bias signal SB1 from the first driving node ND1 of the first driver 111. The first edge detector 361 detects rising edges of the data signal DATA, and generates a first detection signal ST1 accordingly. The second edge detector 362 detects rising edges of the first comparison signal SC1, and generates a second detection signal ST2 accordingly. For example, in the embodiment of FIG. 4, each edge detector with an input terminal IN and an output terminal OUT includes an inverter 412 and an AND gate 414, but the invention is not limited thereto. The inverter 412 has an input terminal coupled to the input terminal IN of the edge detector, and an output terminal. The AND gate 414 has a first input terminal coupled to the input terminal IN of the edge detector, a second input terminal coupled to the output terminal of the inverter 412, and an output terminal used as the output terminal OUT of the edge detector. In one embodiment, the first SR latch 370 includes a first NOR gate 371 and a second NOR gate 372; however, those skilled in the art may implement the SR latch by other configurations such as two cross-coupled NAND gates. The first NOR gate 371 has a first input terminal (acting as the S input of the SR latch) for receiving the first detection signal ST1, a second input terminal, and an output terminal. The second NOR gate 372 has a first input terminal coupled to the output terminal of the first NOR gate 371, a second input terminal (acting as the R input of the SR latch) for receiving the second detection signal ST2, and an output terminal (acting as the Q output of the SR latch) coupled to the second input terminal of the first NOR gate 371. The output terminal of the second NOR gate 372 is further arranged for outputting a first latch signal SR1. The ninth transistor M9 may be an NMOS transistor with a transistor size sufficient to discharge the parasitic capacitances. The ninth transistor M9 has a control terminal for receiving the first latch signal SR1, a first terminal coupled to the ground voltage VSS, and a second terminal coupled to a third driving node ND3. The third driving node ND3 is further coupled to the control terminal of the first transistor M1. With such a design, the ninth transistor M9 of the fast setting circuit 311 provides an additional discharge path for the parasitic capacitor C1 of the first transistor M1, and therefore reduces the transition delay time of the control terminal of the first transistor M1. The reasons will be described in the following embodiments.

Figure 5A:
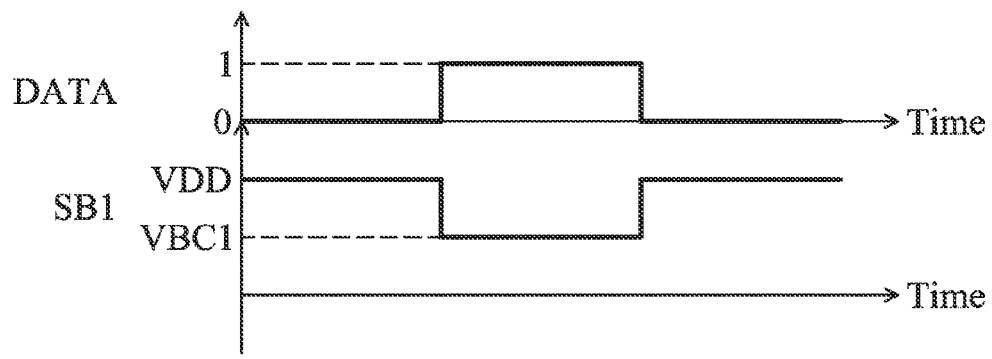
FIG. 5A is a diagram of signal waveforms of a first driver when a first transistor has no parasitic capacitance at its control terminal.
Figure 5B:
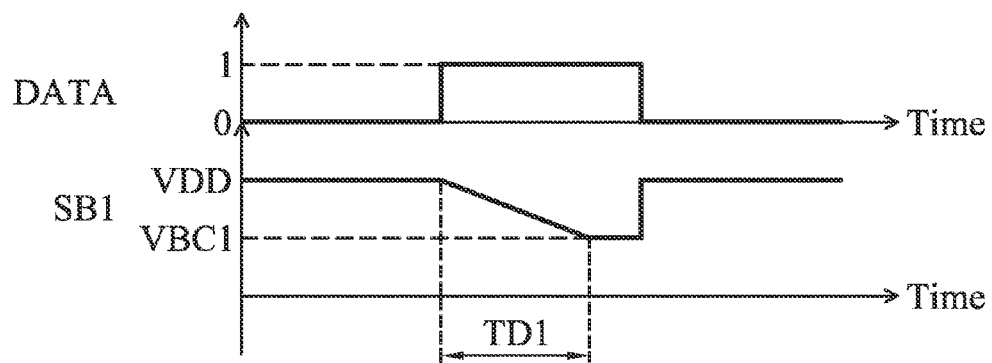
FIG. 5B is a diagram of signal waveforms of a first driver when a first transistor has a large parasitic capacitance at its control terminal.
Figure 5C:
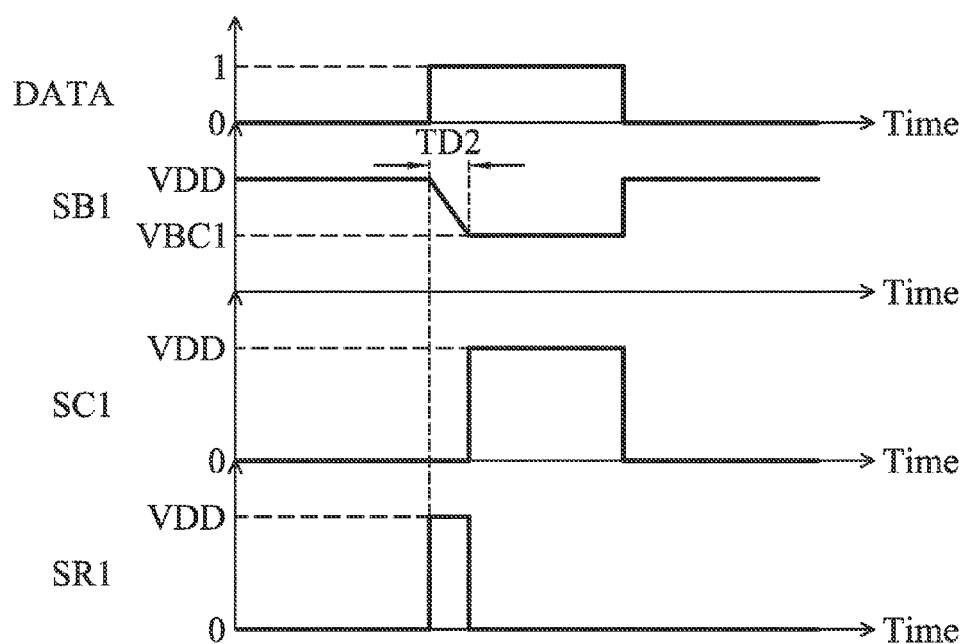
FIG. 5C is a diagram of signal waveforms of a first driver when a first setting circuit is incorporated into a first driver, according to an embodiment of the invention.

FIG. 5A is a diagram of signal waveforms of the first driver 111 when the first transistor M1 has no parasitic capacitance at its control terminal. It is assumed that in an ideal case, the parasitic capacitance of the first transistor M1 is small and negligible. When the data signal DATA input to the first driver 111 shifts from a low logic level (e.g., a logic 0) to a high logic level (e.g., a logic 1), the first bias signal SB1 output from the first driver 111 shifts from a high logic level (e.g., the supply voltage VDD) to a low logic level (e.g., the first constant bias voltage VBC1) immediately. There is no transition delay time in the ideal case of FIG. 5A. FIG. 5B is a diagram of the signal waveforms of the first driver 111 when the first transistor M1 has a large parasitic capacitance at its control terminal. If the parasitic capacitance of the first transistor M1 is considered, the first bias signal SB1 output from the first driver 111 may gradually shift its logic level due to the discharging process of the parasitic capacitor C1, and a transition delay time TD1 may be introduced between the data signal DATA and the first bias signal SB1. FIG. 5C is a diagram of the signal waveforms of the first driver 111 when the fast setting circuit 311 is incorporated into the first driver 111, according to an embodiment of the invention. To overcome the slow transition described in FIG. 5B, the fast setting circuit 311 may be included in the first driver 111 so as to speed up the discharging process of the parasitic capacitor C1. When the data signal DATA transits from low to high, the first edge detector 361 detects the rising edge of the data signal DATA and outputs the first detection signal ST1 with a high logic level to the S input of the first SR latch 370, and thus the first latch signal SR1 is at a high level. During the above transition of the first bias signal SB1, the first comparison signal SC1 output from the first comparator 341 is still at a low logic level, and therefore the first latch signal SR1 output from the SR latch remains at the high level until the first bias signal SB1 reaches the first constant bias voltage VBC1. After then, the first comparison signal SC1 transits from low to high, the second edge detector 362 detects the rising edge of the first comparison signal SC1 and outputs the second detection signal ST2 with a high logic level to the R input of the first SR latch 370, and thus the first latch signal SR1 is at a low level. The pulse of the first latch signal SR1 temporarily turns on the ninth transistor M9, such that the fast setting circuit 311 provides an additional discharge path for the parasitic capacitor C1 and pulls down the logic level of the first bias signal SB1 within a shorter transition delay time TD2. By using the fast setting circuit 311, the transition delay time of the first driver 111 can be significantly reduced, and the operating speed of the first driver 111 and the first transistor M1 can be identical to that of the ideal case of FIG. 5A.

Figure 3B:
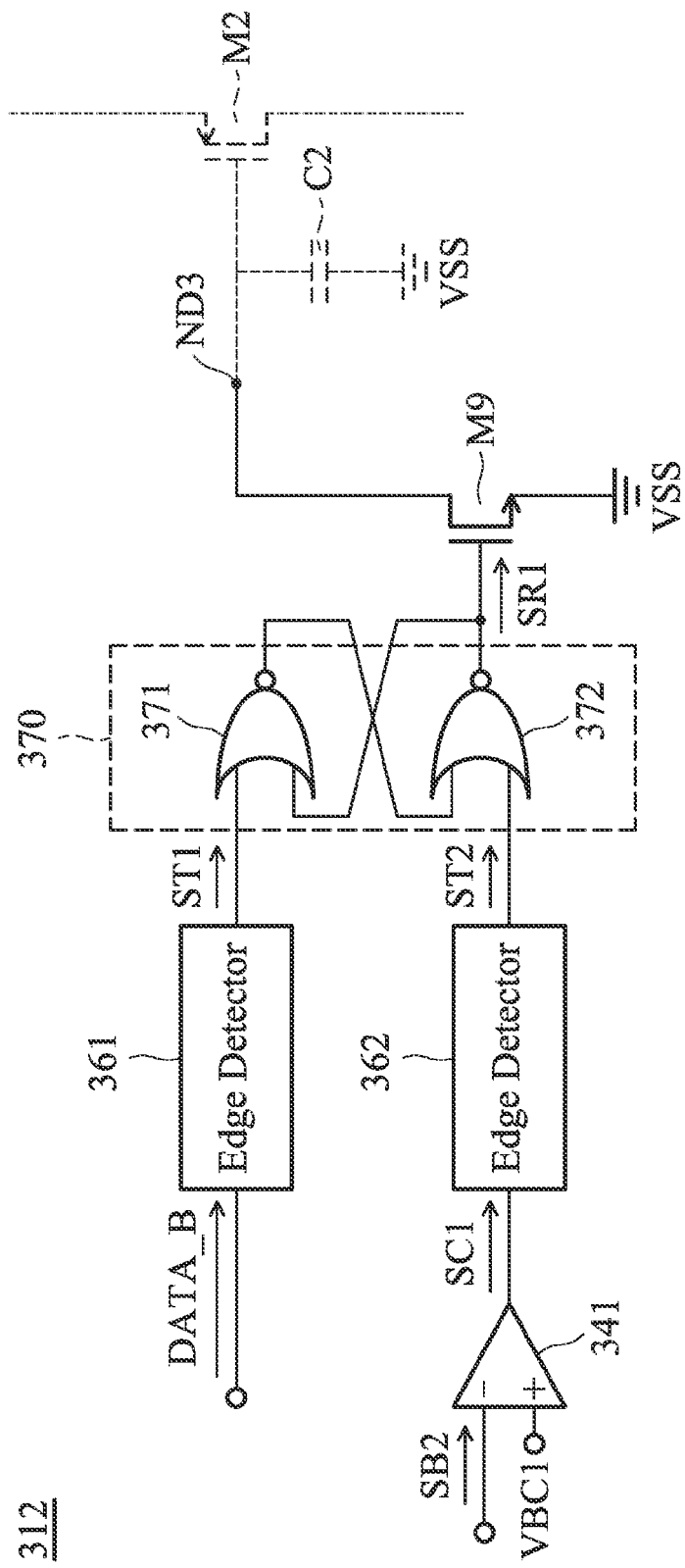
FIG. 3B is a diagram of a fast setting circuit of a second driver according to an embodiment of the invention.

FIG. 3B is a diagram of the fast setting circuit 312 of the second driver 112 according to an embodiment of the invention. The fast setting circuit 312 of the second driver 112 of FIG. 3B is similar to the fast setting circuit 311 of the first driver 111 of FIG. 3A. The difference between them is that in the fast setting circuit 312 of the second driver 112, the negative input terminal of the first comparator 341 is arranged for receiving the second bias signal SB2, the first edge detector 361 detects rising edge of the inverted data signal DATA_B and generates the first detection signal ST1, and the third driving node ND3 is coupled to the control terminal of the second transistor M2. It should be understood that the fast setting circuit 312 of the second driver 112 does not share any elements (e.g., the first comparator 341, the ninth transistor M9, etc., which appear in both FIG. 3A and FIG. 3B) with the fast setting circuit 311 of the first driver 111. The same reference numerals of elements are used for readers to understand that the two circuits have similar structures and partially-identical elements. As a matter of fact, every element of FIG. 3B is independent of that of FIG. 3A. The ninth transistor M9 of the fast setting circuit 312 provides an additional discharge path for the parasitic capacitor C2 of the second transistor M2, and therefore reduces the transition delay time of the control terminal of the second transistor M2.

Figure 3C:
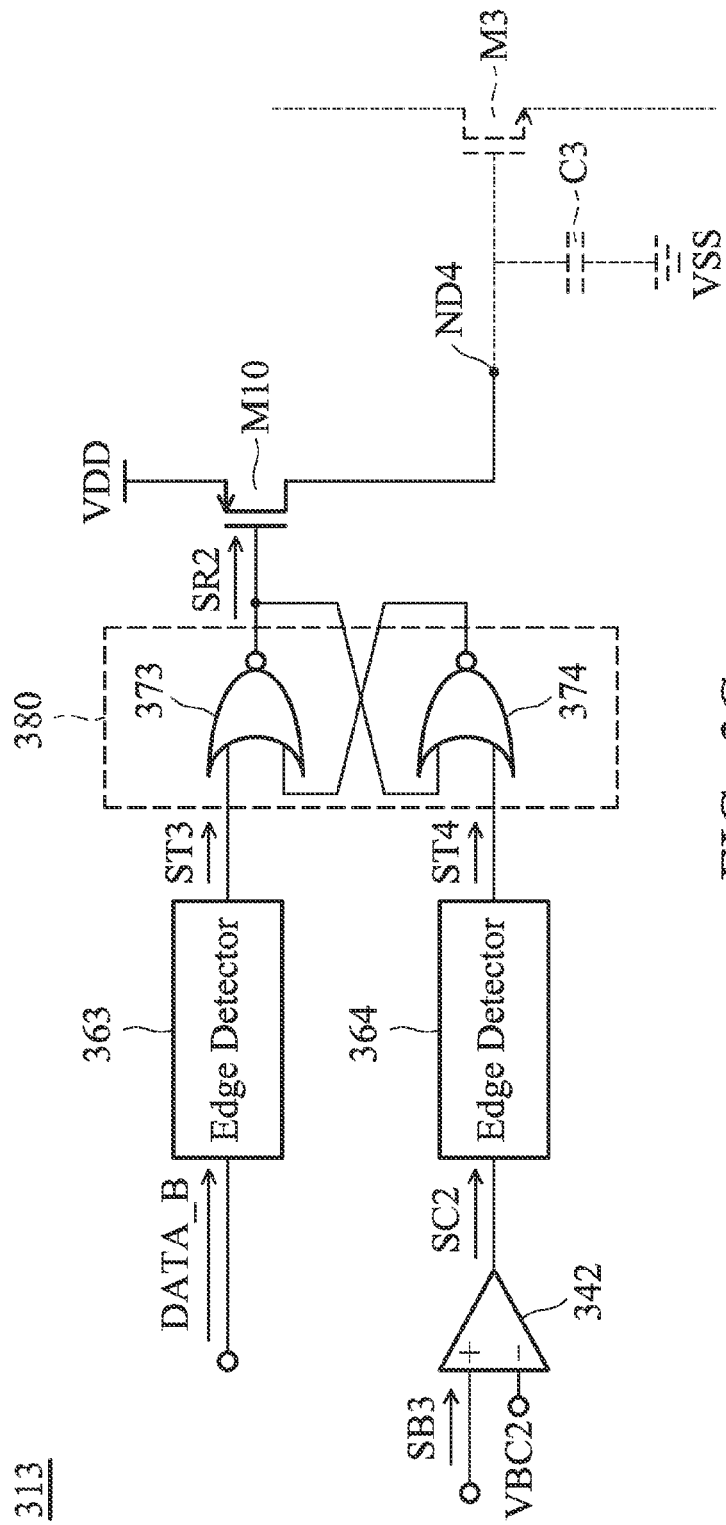
FIG. 3C is a diagram of a fast setting circuit of a third driver according to an embodiment of the invention.

FIG. 3C is a diagram of the fast setting circuit 313 of the third driver 113 according to an embodiment of the invention. In the embodiment of FIG. 3C, the fast setting circuit 313 of the third driver 113 includes a second comparator 342, a third edge detector 363, a fourth edge detector 364, a second SR latch 380, and a tenth transistor M10. The second comparator 342 may be implemented with an operational amplifier having no feedback path. The second comparator 342 has a negative input terminal for receiving the second constant bias voltage VBC2, a positive input terminal for receiving the third bias signal SB3, and an output terminal for outputting a second comparison signal SC2 according to a voltage difference between the second constant bias voltage VBC2 and the third bias signal SB3 from the second driving node ND2 of the third driver 113. The third edge detector 363 detects rising edges of the inverted data signal DATA_B, and generates a third detection signal ST3 accordingly. The fourth edge detector 364 detects rising edges of the second comparison signal SC2, and generates a fourth detection signal ST4 accordingly. The detailed circuit of each edge detector has been described in the embodiment of FIG. 4. In one embodiment, the second SR latch 380 includes a third NOR gate 373 and a fourth NOR gate 374; however, those skilled in the art may implement the SR latch by other configurations such as two cross-coupled NAND gates. The third NOR gate 373 has a first input terminal (acting as the R input of the SR latch) for receiving the third detection signal ST3, a second input terminal, and an output terminal (acting as the Q output of the SR latch). The fourth NOR gate 374 has a first input terminal coupled to the output terminal of the third NOR gate 373, a second input terminal (acting as the S input of the SR latch) for receiving the fourth detection signal ST4, and an output terminal coupled to the second input terminal of the third NOR gate 373. The output terminal of the third NOR gate 373 is further arranged for outputting a second latch signal SR2. The tenth transistor M10 may be a PMOS transistor with a transistor size sufficient to discharge the parasitic capacitances. The tenth transistor M10 has a control terminal for receiving the second latch signal SR2, a first terminal coupled to the supply voltage VDD, and a second terminal coupled to a fourth driving node ND4. The fourth driving node ND4 is further coupled to the control terminal of the third transistor M3. The operation principles of the fast setting circuit 313 are similar to those of the fast setting circuit 311 described in above, and the logic level of the third bias signal SB3 may be pulled up from a low logic level (e.g., the ground voltage VSS) to a high logic level (e.g., the second constant bias voltage VBC2) within a shorter transition delay time. With such a design, the tenth transistor M10 of the fast setting circuit 314 provides an additional charge path for the parasitic capacitor C3 of the third transistor M3, and therefore reduces the transition delay time of the control terminal of the third transistor M3.

Figure 3D:
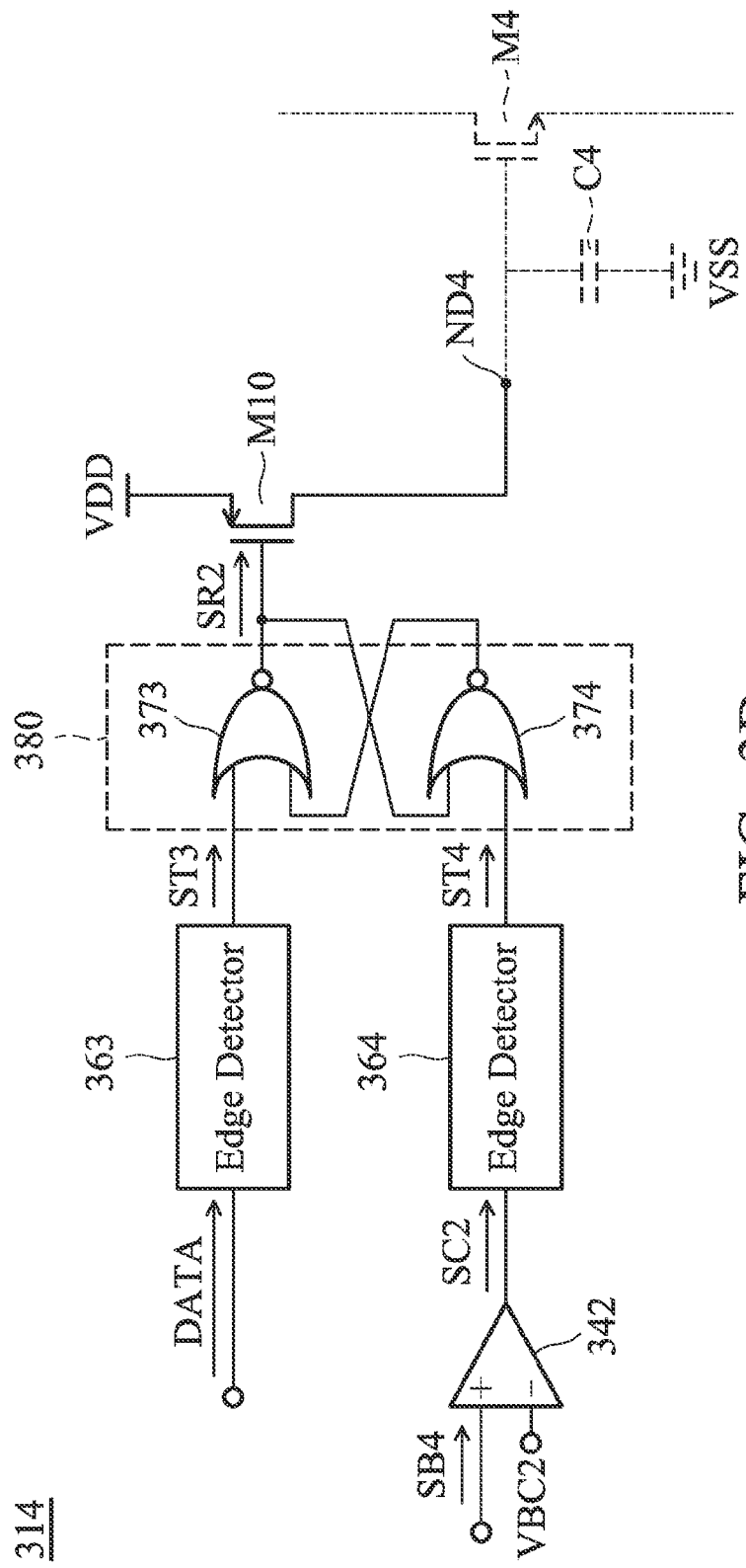
FIG. 3D is a diagram of a fast setting circuit of a fourth driver according to an embodiment of the invention.

FIG. 3D is a diagram of the fast setting circuit 314 of the fourth driver 114 according to an embodiment of the invention. The fast setting circuit 314 of the fourth driver 114 of FIG. 3D is similar to the fast setting circuit 313 of the third driver 113 of FIG. 3C. The difference between them is that in the fast setting circuit 314 of the fourth driver 114, the positive input terminal of the second comparator 342 is arranged for receiving the fourth bias signal SB4, the third edge detector 363 detects rising edge of the data signal DATA and generates the third detection signal ST3, and the fourth driving node ND4 is coupled to the control terminal of the fourth transistor M4. It should be understood that the fast setting circuit 314 of the fourth driver 114 does not share any elements with the fast setting circuit 313 of the third driver 113. Every element of FIG. 3D is independent of that of FIG. 3C. The tenth transistor M10 of the fast setting circuit 314 provides an additional charge path for the parasitic capacitor C4 of the fourth transistor M4, and therefore reduces the transition delay time of the control terminal of the fourth transistor M4.

The invention provides a novel design of LVDS driving circuit. In the conclusion, the proposed LVDS driving circuit 110 has at least the following advantages, compared with the prior art: (1) omitting the use of current sources and current sinks; (2) increasing the head room and widening the output range; (3) being suitable for applications of advanced processes with very low supply voltages; (4) enhancing the operating speed; and (5) decreasing the manufacturing cost.

Note that the above signal voltages, currents, resistances, and other element parameters are not limitations of the invention. A designer can adjust these parameters according to different requirements. The LVDS driving circuit of the invention is not limited to the configurations of FIGS. 1-5. The invention may merely include any one or more features of any one or more embodiments of FIGS. 1-5. In other words, not all of the features displayed in the figures should be implemented in the LVDS driving circuit of the invention. In addition, the first transistor M1, the second transistor M2, the third transistor M3, and the fourth transistor M4 of the LVDS driving circuit 100 may be implemented by other configurations such as all N-type transistors or all P-type transistors with the polarities of the signals and devices correspondingly changed without departing from the principles of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. An LVDS (Low Voltage Differential Signaling) driving circuit generating a differential signal at a first node and a second node according to a data signal, comprising:
    a first transistor, comprising a first terminal coupled to a supply voltage and a second terminal coupled to the first node, wherein the first transistor and a first driver form a first current mirror when the data signal is at a high logic level and do not form the first current mirror when the data signal is at a low logic level;
    a second transistor, comprising a first terminal coupled to the supply voltage and a second terminal coupled to the second node, wherein the second transistor and a second driver form a second current mirror when the data signal is at the low logic level and do not form the second current mirror when the data signal is at the high logic level;
    a third transistor, comprising a first terminal coupled to a ground voltage and a second terminal coupled to the first node, wherein the third transistor and a third driver form a third current mirror when the data signal is at the low logic level and do not form the third current mirror when the data signal is at the high logic level; and
    a fourth transistor, comprising a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level,
    wherein each of the first driver and the second driver comprises a first current sink drawing a current from a fourth node.

2. The LVDS driving circuit as claimed in claim 1, wherein each of the first driver and the second driver further comprises:
    a fifth transistor, wherein the fifth transistor has a control terminal coupled to the fourth node, a first terminal coupled to the supply voltage, and a second terminal coupled to the fourth node, wherein the fourth node has a first constant bias voltage;
    a first operational amplifier, wherein the first operational amplifier has a negative input terminal coupled to the fourth node, a positive input terminal coupled to a first driving node, and an output terminal coupled to the positive input terminal according to the data signal,
    wherein the first driving node of the first driver is coupled to a control terminal of the first transistor and the first driving node of the second driver is coupled to a control terminal of the second transistor.

3. The LVDS driving circuit as claimed in claim 2, wherein each of the first driver and the second driver further comprises:
    a first switch, wherein the first switch has a first terminal coupled to the output terminal of the first operational amplifier, and a second terminal;
    a second switch, wherein the second switch has a first terminal coupled to the second terminal of the first switch, and a second terminal coupled to the ground voltage; and
    a sixth transistor, wherein the sixth transistor has a control terminal coupled to the second terminal of the first switch, a first terminal coupled to the supply voltage, and a second terminal coupled to the first driving node.

4. The LVDS driving circuit as claimed in claim 3, wherein in the first driver, the first switch is on and the second switch is off when the data signal is at the low logic level, and the first switch is off and the second switch is on when the data signal is at the high logic level, and wherein in the second driver, the first switch is on and the second switch is off when the data signal is at the high logic level, and the first switch is off and the second switch is on when the data signal is at the low logic level.

5. The LVDS driving circuit as claimed in claim 2, wherein each of the first driver and the second driver further comprises a fast setting circuit coupling a third driving node to the ground voltage according to a voltage difference between the first constant bias voltage and the first driving node, wherein the third driving node of the fast setting circuit of the first driver is coupled to the control terminal of the first transistor and the third driving node of the fast setting circuit of the second driver is coupled to the control terminal of the second transistor.

6. The LVDS driving circuit as claimed in claim 5, wherein the fast setting circuit comprises:
    a first comparator, outputting a first comparison signal according to the voltage difference between the first constant bias voltage and the first driving node;

a first edge detector, detecting rising edges of the data signal or an inverted data signal, and generating a first detection signal;

a second edge detector, detecting rising edges of the first comparison signal, and generating a second detection signal;

a first SR latch, comprising an S input receiving the first detection signal, an R input receiving the second detection signal, and an output; and a ninth transistor, wherein the ninth transistor has a control terminal coupled to the output of the first SR latch, a first terminal coupled to the ground voltage, and a second terminal coupled to the third driving node.

7. An LVDS (Low Voltage Differential Signaling) driving circuit generating a differential signal at a first node and a second node according to a data signal, comprising:

a first transistor, comprising a first terminal coupled to a supply voltage and a second terminal coupled to the first node, wherein the first transistor and a first driver form a first current mirror when the data signal is at a high logic level and do not form the first current mirror when the data signal is at a low logic level;

a second transistor, comprising a first terminal coupled to the supply voltage and a second terminal coupled to the second node, wherein the second transistor and a second driver form a second current mirror when the data signal is at the low logic level and do not form the second current mirror when the data signal is at the high logic level;

a third transistor, comprising a first terminal coupled to a ground voltage and a second terminal coupled to the first node, wherein the third transistor and a third driver form a third current mirror when the data signal is at the low logic level and do not form the third current mirror when the data signal is at the high logic level; and a fourth transistor, comprising a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level, wherein each of the third driver and the fourth driver comprises a first current source supplying a current to a sixth node.

8. The LVDS driving circuit as claimed in claim 7, wherein each of the third driver and the fourth driver further comprises:

a seventh transistor, wherein the seventh transistor has a control terminal coupled to a sixth node, a first terminal coupled to the ground voltage, and a second terminal coupled to the sixth node, wherein the sixth node has a second constant bias voltage; and a second operational amplifier, wherein the second operational amplifier has a negative input terminal coupled to the sixth node, a positive input terminal coupled to a second driving node, and an output terminal coupled to the positive input terminal according to the data signal, wherein the second driving node of the third driver is coupled to a control terminal of the third transistor and the second driving node of the fourth driver is coupled to a control terminal of the fourth transistor.

9. The LVDS driving circuit as claimed in claim 8, wherein each of the third driver and the fourth driver further comprises:

a fourth switch, wherein the fourth switch has a first terminal coupled to the output terminal of the second operational amplifier, and a second terminal;

a third switch, wherein the third switch has a first terminal coupled to the second terminal of the fourth switch, and a second terminal coupled to the supply voltage; and an eighth transistor, wherein the eighth transistor has a control terminal coupled to the second terminal of the fourth switch, a first terminal coupled to the ground voltage, and a second terminal coupled to the second driving node.

10. The LVDS driving circuit as claimed in claim 9, wherein in the third driver, the third switch is on and the fourth switch is off when the data signal is at the high logic level, and the third switch is off and the fourth switch is on when the data signal is at the low logic level, and wherein in the fourth driver, the third switch is on and the fourth switch is off when the data signal is at the low logic level, and the third switch is off and the fourth switch is on when the data signal is at the high logic level.

11. The LVDS driving circuit as claimed in claim 8, wherein each of the third driver and the fourth driver further comprises a fast setting circuit coupling a fourth driving node to the supply voltage according to a voltage difference between the second constant bias voltage and the second driving node, wherein the fourth driving node of the fast setting circuit of the third driver is coupled to the control terminal of the third transistor and the fourth driving node of the fast setting circuit of the fourth driver is coupled to the control terminal of the fourth transistor.

12. The LVDS driving circuit as claimed in claim 11, wherein the fast setting circuit comprises:

a second comparator, outputting a second comparison signal according to the voltage difference between the second constant bias voltage and the second driving node;

a third edge detector, detecting rising edges of the data signal or an inverted data signal, and generating a third detection signal;

a fourth edge detector, detecting rising edges of the second comparison signal, and generating a fourth detection signal;

a second SR latch, comprising an S input receiving the fourth detection signal, an R input receiving the third detection signal, and an output; and a tenth transistor, wherein the tenth transistor has a control terminal coupled to the output of the second SR latch, a first terminal coupled to the supply voltage, and a second terminal coupled to the fourth driving node.

13. An LVDS (Low Voltage Differential Signaling) driving circuit generating a differential signal at a first node and a second node according to a data signal, comprising:

a first transistor, comprising a first terminal coupled to a supply voltage and a second terminal coupled to the first node, wherein the first transistor and a first driver form a first current mirror when the data signal is at a high logic level and do not form the first current mirror when the data signal is at a low logic level;

a second transistor, comprising a first terminal coupled to the supply voltage and a second terminal coupled to the second node, wherein the second transistor and a second driver form a second current mirror when the data signal is at the low logic level and do not form the second current mirror when the data signal is at the high logic level;

a third transistor, comprising a first terminal coupled to a ground voltage and a second terminal coupled to the first node, wherein the third transistor and a third driver form a third current mirror when the data signal is at the low logic level and do not form the third current mirror when the data signal is at the high logic level; and a fourth transistor, comprising a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level, wherein each of the first driver and the second driver comprises a first operational amplifier, wherein the first operational amplifier has a negative input terminal coupled to a fourth node, a positive input terminal coupled to a first driving node, and an output terminal coupled to the positive input terminal according to the data signal, wherein the first driving node of the first driver is coupled to a control terminal of the first transistor and the first driving node of the second driver is coupled to a control terminal of the second transistor.

14. The LVDS driving circuit as claimed in claim 13, wherein each of the first driver and the second driver further comprises:
a fifth transistor, wherein the fifth transistor has a control terminal coupled to the fourth node, a first terminal coupled to the supply voltage, and a second terminal coupled to the fourth node, wherein the fourth node has a first constant bias voltage; and
a first current sink, drawing a current from the fourth node.

15. The LVDS driving circuit as claimed in claim 14, wherein each of the first driver and the second driver further comprises:
a first switch, wherein the first switch has a first terminal coupled to the output terminal of the first operational amplifier, and a second terminal;
a second switch, wherein the second switch has a first terminal coupled to the second terminal of the first switch, and a second terminal coupled to the ground voltage; and
a sixth transistor, wherein the sixth transistor has a control terminal coupled to the second terminal of the first switch, a first terminal coupled to the supply voltage, and a second terminal coupled to the first driving node.

16. The LVDS driving circuit as claimed in claim 15, wherein in the first driver, the first switch is on and the second switch is off when the data signal is at the low logic level, and the first switch is off and the second switch is on when the data signal is at the high logic level, and wherein in the second driver, the first switch is on and the second switch is off when the data signal is at the high logic level, and the first switch is off and the second switch is on when the data signal is at the low logic level.

17. The LVDS driving circuit as claimed in claim 14, wherein each of the first driver and the second driver further comprises a fast setting circuit coupling a third driving node to the ground voltage according to a voltage difference between the first constant bias voltage and the first driving node, wherein the third driving node of the fast setting circuit of the first driver is coupled to the control terminal of the first transistor and the third driving node of the fast setting circuit of the second driver is coupled to the control terminal of the second transistor.

18. The LVDS driving circuit as claimed in claim 17, wherein the fast setting circuit comprises:

a first comparator, outputting a first comparison signal according to the voltage difference between the first constant bias voltage and the first driving node;
a first edge detector, detecting rising edges of the data signal or an inverted data signal, and generating a first detection signal;
a second edge detector, detecting rising edges of the first comparison signal, and generating a second detection signal;
a first SR latch, comprising an S input receiving the first detection signal, an R input receiving the second detection signal, and an output; and
a ninth transistor, wherein the ninth transistor has a control terminal coupled to the output of the first SR latch, a first terminal coupled to the ground voltage, and a second terminal coupled to the third driving node.

19. An LVDS (Low Voltage Differential Signaling) driving circuit generating a differential signal at a first node and a second node according to a data signal, comprising:
a first transistor, comprising a first terminal coupled to a supply voltage and a second terminal coupled to the first node, wherein the first transistor and a first driver form a first current mirror when the data signal is at a high logic level and do not form the first current mirror when the data signal is at a low logic level;
a second transistor, comprising a first terminal coupled to the supply voltage and a second terminal coupled to the second node, wherein the second transistor and a second driver form a second current mirror when the data signal is at the low logic level and do not form the second current mirror when the data signal is at the high logic level;
a third transistor, comprising a first terminal coupled to a ground voltage and a second terminal coupled to the first node, wherein the third transistor and a third driver form a third current mirror when the data signal is at the low logic level and do not form the third current mirror when the data signal is at the high logic level; and
a fourth transistor, comprising a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level, wherein each of the third driver and the fourth driver comprises a second operational amplifier, wherein the second operational amplifier has a negative input terminal coupled to a sixth node, a positive input terminal coupled to a second driving node, and an output terminal coupled to the positive input terminal according to the data signal, wherein the second driving node of the third driver is coupled to a control terminal of the third transistor and the second driving node of the fourth driver is coupled to a control terminal of the fourth transistor.

20. The LVDS driving circuit as claimed in claim 19, wherein each of the third driver and the fourth driver further comprises:
a seventh transistor, wherein the seventh transistor has a control terminal coupled to a sixth node, a first terminal coupled to the ground voltage, and a second terminal coupled to the sixth node, wherein the sixth node has a second constant bias voltage; and
a first current source, supplying a current to the sixth node.

21. The LVDS driving circuit as claimed in claim 20, wherein each of the third driver and the fourth driver further comprises:

a fourth switch, wherein the fourth switch has a first terminal coupled to the output terminal of the second operational amplifier, and a second terminal;

a third switch, wherein the third switch has a first terminal coupled to the second terminal of the fourth switch, and a second terminal coupled to the supply voltage; and an eighth transistor, wherein the eighth transistor has a control terminal coupled to the second terminal of the fourth switch, a first terminal coupled to the ground voltage, and a second terminal coupled to the second driving node.

22. The LVDS driving circuit as claimed in claim 21, wherein in the third driver, the third switch is on and the fourth switch is off when the data signal is at the high logic level, and the third switch is off and the fourth switch is on when the data signal is at the low logic level, and wherein in the fourth driver, the third switch is on and the fourth switch is off when the data signal is at the low logic level, and the third switch is off and the fourth switch is on when the data signal is at the high logic level.

23. The LVDS driving circuit as claimed in claim 20, wherein each of the third driver and the fourth driver further comprises a fast setting circuit coupling a fourth driving node to the supply voltage according to a voltage difference between the second constant bias voltage and the second driving node, wherein the fourth driving node of the fast setting circuit of the third driver is coupled to the control terminal of the third transistor and the fourth driving node of the fast setting circuit of the fourth driver is coupled to the control terminal of the fourth transistor.

24. The LVDS driving circuit as claimed in claim 23, wherein the fast setting circuit comprises:

a second comparator, outputting a second comparison signal according to the voltage difference between the second constant bias voltage and the second driving node;

a third edge detector, detecting rising edges of the data signal or an inverted data signal, and generating a third detection signal;

a fourth edge detector, detecting rising edges of the second comparison signal, and generating a fourth detection signal;

a second SR latch, comprising an S input receiving the fourth detection signal, an R input receiving the third detection signal, and an output; and a tenth transistor, wherein the tenth transistor has a control terminal coupled to the output of the second SR latch, a first terminal coupled to the supply voltage, and a second terminal coupled to the fourth driving node.

\* \* \* \* \*